United States Patent [19]
Jesman et al.

[11] Patent Number: 5,212,492
[45] Date of Patent: May 18, 1993

[54] MATCHING ELEMENT FOR MOBILE ANTENNA

[76] Inventors: Andrew Jesman, 10 Little Warren Close, Guildford, Surrey GU4 8PW; Christopher Jesman, 46 Cole Park Road, Twickenham, Middlesex TW1 2HS, both of United Kingdom

[21] Appl. No.: 682,335

[22] Filed: Apr. 9, 1991

[30] Foreign Application Priority Data

Apr. 9, 1990 [GB] United Kingdom ............... 9007979

[51] Int. Cl.⁵ ........................... H01Q 1/32; H01Q 1/50
[52] U.S. Cl. .................................... 343/713; 343/860
[58] Field of Search ........................ 343/713, 715, 860

[56] References Cited

U.S. PATENT DOCUMENTS

| | | | |
|---|---|---|---|
| 4,089,817 | 5/1978 | Kirkendall | 343/713 |
| 4,785,305 | 11/1988 | Shyu | 343/715 |
| 4,882,592 | 11/1989 | Studer, Jr. et al. | 343/715 |
| 4,916,456 | 4/1990 | Shyu | 343/715 |
| 4,929,961 | 5/1990 | Nakase | 343/715 |
| 4,931,806 | 6/1990 | Wunderlich | 343/715 |
| 4,992,800 | 2/1991 | Parfitt | 343/715 |
| 4,999,642 | 3/1991 | Wells | 343/715 |

FOREIGN PATENT DOCUMENTS 0137391 4/1985 United Kingdom .
2210730 6/1989 United Kingdom .

Primary Examiner—Michael C. Wimer
Attorney, Agent, or Firm—Jacobson, Price, Holman & Stern

[57] ABSTRACT

A coupling unit forming a termination circuit having capacitance and inductance distributed in such a manner as to match and balance a screen mounted antenna comprises a circuit board substrate (1) provided on both sides with patterns of conductive cladding that are configured to provide a capacitor plate (2) for capacitive coupling to a base mounting of the antenna and further elements (3,9,10,12,14,17) that provide the required inductive and capacitive characteristics to enable the termination circuit to match and balance the antenna.

3 Claims, 2 Drawing Sheets

MATCHING ELEMENT FOR MOBILE ANTENNA

BACKGROUND OF THE INVENTION

This invention relates to a matching element for a mobile antenna, more especially an antenna of the kind intended to be attached to a glass screen e.g. a windshield, of a motor vehicle.

Antennas of the kind mentioned above are well-known and generally comprise a radiating antenna element adhesively secured to the exterior of a glass screen, and a coupling pad adhesively secured to the interior of the screen in facing relationship to the antenna element. Capacitative coupling between the external antenna and the internal pad is provided by overlapping conductive plates arranged externally and internally of the glass screen. The internal coupling pad should also incorporate an impedance matching circuit for matching the antenna to the conventional 50 ohm coaxial cable.

In hitherto known arrangements, the impedance matching circuit may be formed by an electrically conductive shell of the coupling pad which forms a ground plane in relation to the internal plate of the coupling capacitor. By connecting the external conductor of the coaxial cable to the ground plane and by connecting tappings from the central conductor of the coaxial cable to the ground plane as well as to the internal plate of the coupling capacitor, an inductive and capacitive network can be established that will provide the desired matching. However, careful adjustment of the position of the ground plane relatively to the capacitor plate and of the lengths of the tappings from the central conductor is required in order to obtain an appropriately tuned circuit, and it is difficult to manufacture such units in mass production whilst maintaining a consistent performance of the coupling units. Furthermore because air forms the dielectric medium of the tuned capacitance, the impedance matching circuit can be rendered ineffective by the presence of moisture in the air. This is a particular problem because of the tendency of moisture to form by condensation near the internal surface of a motor vehicle window.

SUMMARY OF THE INVENTION

It is an object of the present invention to provide an improved coupling unit for use with a screen-mounted antenna, which is of simplified construction and more readily fabricated in mass production.

In accordance with the invention a coupling unit for use with a screen-mounted antenna comprises a circuit board substrate of suitable dielectric material having patterns of conductive cladding material on both surfaces thereof, the said pattern on one surface of the board that is intended for attachment in facing relationship to a surface of a screen comprising a capacitor plate for providing capacitative coupling to the base mounting of an antenna that is to be attached to the opposite surface of the screen, the said patterns of conductive cladding material being so shaped and arranged as to form in cooperation with said capacitor plate a termination circuit for said antenna, and the said patterns further including terminal portions for connection to conductors to be coupled to said termination circuit.

In the arrangement according to the invention, the dielectric of the capacitance of the termination circuit is provided by the material of the circuit board substrate and thus the coupling unit is impervious to moisture. By selection of the material and thickness of the substrate, together with the size and shape of the areas of conductive cladding, the characteristics of any given circuit required to match and balance an antenna length which is a multiple of one-eighth wavelength can be determined by a single integrated component that is easy to manufacture.

BRIEF DESCRIPTION OF THE DRAWINGS

The invention is illustrated by way of example in the accompanying drawings, in which.

DETAILED DESCRIPTION OF THE DRAWINGS

Figure 1:
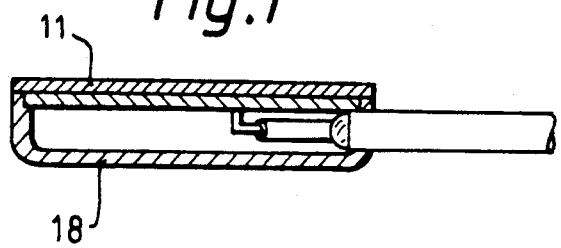
FIG. 1 is a sectional side view of a coupling unit in accordance with the invention.

Referring to the drawings a coupling unit in accordance with the invention comprises a circuit board substrate 1 of any suitable insulating material, provided on one side with a conductive cladding element 2 forming a capacitor plate and an element 14 which contributes to the matching and balancing of the antenna. On the opposite side of the circuit board 1 are provided further conductive elements 3 and 12 completing the matching and balancing circuit. A coaxial cable 4 to be coupled to an antenna element has a central conductor 5 that is soldered both to the element 2 at point 6 and to the element 3 at point 7. The outer screening braid of the coaxial cable 4 is also soldered to the element 12 at points 8 and 13. Conductive element 17 joins elements 3 and 12. It will be noted that the element 3 is in the form of a generally ring-shaped conductor portion 9 having internally directed web portions 10 and 19. Web portion 10 provides a terminal connection for the central conductor 5 of the coaxial cable 4. The coaxial cable 4 is soldered to the terminal portions 6,7,8 and 13 in such manner that the conductive paths provided between the terminals 6 and 7 and the terminals 7 and 8 each have a defined length, and this is conjunction with the illustrated shape and arrangement of the elements 2 and 3 is effective to provide an inductive coupling between the coaxial cable 4 and the antenna in a network that also incorporates distributed inductance and capacitance as generally illustrated in the equivalent circuit of FIG. 4. The outer conductor of coaxial cable 4 is also electrically connected to element 14 at points 15 and 16.

As illustrated in FIG. 1, the screen-side of the circuit board 1 is covered with an adhesive pad 11 capable of being secured to a glass screen, whereas the reverse side of the circuit board and the coaxial cable 4 are encapsulated in a synthetic plastics moulding 18.

Figure 3:
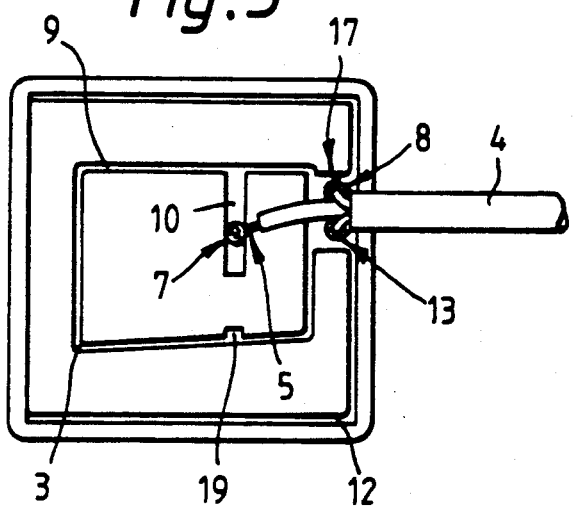
FIG. 3 is a view of the opposite side of the circuit board.
Figure 4:
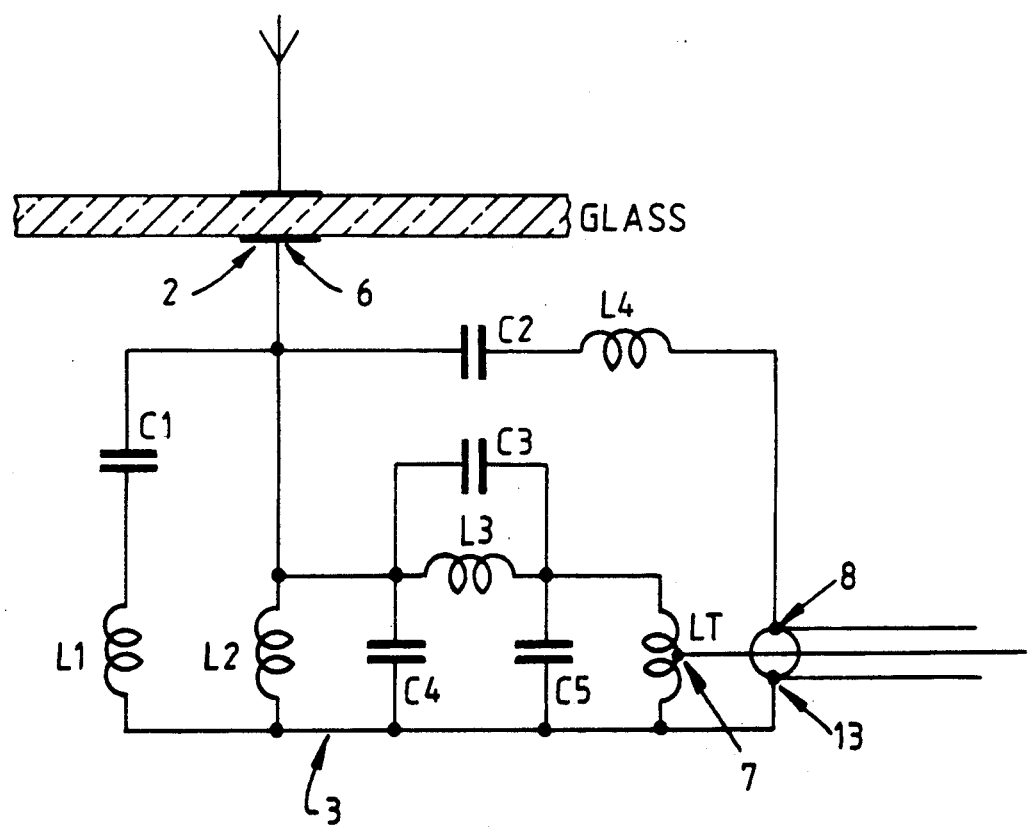
FIG. 4 is an equivalent circuit diagram of the coupling unit shown in FIGS. 1 to 3.

The arrangement illustrated is capable of being manufactured economically in mass production whilst maintaining close tolerances of the values of the components of the equivalent circuit of FIG. 4. In FIG. 4 the reference numerals $C_1$, $C_2$, $C_3$, $C_4$ and $C_5$ illustrate distributed capacity, the reference numerals $L_1$, $L_2$, $L_3$ and $L_4$ represent distributed inductance, and the reference $L_T$ acts as a 'choke' to prevent current existing on the outer conductor of the coaxial cable 4. The remaining reference numerals illustrate elements already described with reference to FIGS. 1 to 3.

Figure 2:
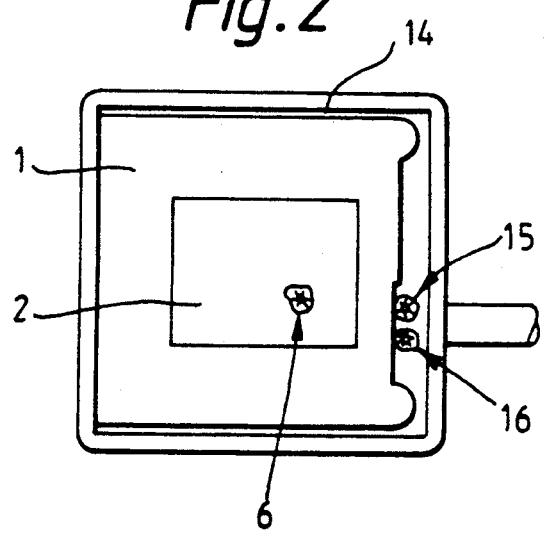
FIG. 2 is a view of the circuit board of the unit of FIG. 1, from the screen-side of the board.

The manner in which the construction of FIGS. 1–3 provides the equivalent circuit of FIG. 4 will be understood by reference to the table below wherein the circuit elements of FIG. 4 are related to the physical elements of FIGS. 1–3:

L1, L4—The distributed inductance of elements 12 and 14

C1, C2—The distributed capacitance caused by elements 12 and 17 overlapping element 14.

Lt—Transformation obtained due to the physical shape and dimensions of elements 3.

L2—The distributed inductance of the wire joining points 7 and 6 through the board.

C4—The distributed capacitance caused by element 10 overlapping element 2.

C3—The distributed capacitance caused by element 9 partially overlapping element 2.

L3—The distributed inductance of element 9.

C5—The distributed capacitance caused by the proximity of element 10 to element 17.

It will be understood that various alterations and modifications may be made to the arrangement as illustrated without departing from the scope of the invention.

For example, although the matching and balancing circuit, element 3, is shown as having a ring-shaped portion 9, it may not be strictly necessary for the portion 9 to form a complete ring, provided that the conductive connection between terminals 7 and 8 and 13 is maintained. Also, a coaxial connector of any suitable type can be electrically connected to the matching and balancing circuit in place of the coaxial cable 4 as long as the inner and outer conductor connections are properly made as shown in FIGS. 1, 2 and 3 in the case of cable connection. Sections 12 and 14 can be adjusted to vary the frequency of operation thus allowing the arrangement to be used in several applications of differing frequency.

As well as direct connections to the matching and balancing circuit via a coaxial connector or coaxial cable, it is possible to replace these with any suitable two port antenna with one port electrically connected to points 8 and 16 or 13 and 15 and the other port electrically connected to points 6 and 7. This configuration allows the arrangement to be used as a window mounted passive repeater to improve the service obtained when using hand portable transceivers inside vehicles.

We claim:

1. A coupling unit for use with an antenna adapted to be secured to one surface of a window of dielectric material and including a termination circuit for said antenna, the coupling unit providing a matched coupling between the antenna and the termination circuit, said coupling unit comprising: a circuit board substrate of dielectric material; a first area of conductive cladding forming a capacitor plate on a first surface of said substrate to be fastened to said window; a first terminal means of said termination circuit connected to said first area of conductive cladding; a second area of conductive cladding provided on said first surface of said substrate and shaped to form an inductance; a second terminal means of said termination circuit connected to said second area of conductive cladding; a third area of conductive cladding shaped to form an inductance and provided on a second surface of said substrate opposite said first surface, said third area of cladding connected to said second terminal means and overlying said second area of conductive cladding whereby said second and third areas of conductive cladding provide distributed inductance and capacitance acting to provide matched coupling between said first area of conductive cladding and said second terminal means; and a fourth area of conductive cladding shaped to form an inductance and provided on said second surface of said substrate, said fourth area of conductive cladding connected to said first terminal means and overlying said first area of conductive cladding whereby said first and fourth areas of conductive cladding provide distributed inductance and capacitance between said first terminal means and the capacitor plate formed by said first area of cladding; and wherein said fourth area of conductive cladding is substantially in the shape of a ring with a web portion coupled to the periphery of said ring and extending inwardly of said periphery, said web portion being connected to said first terminal means and said periphery connected to said second terminal means.

2. An impedance matching unit according to claim 1, wherein said second area of conductive cladding is in the shape of a U spaced from and bounding three sides of said first area of conductive cladding.

3. An impedance matching unit according to claim 2, wherein said third area of conductive cladding is in the shape of a U and bounds three sides of said ring.

* * * * *